United States Patent [19]
Ushikubo et al.

[11] Patent Number: 5,851,841
[45] Date of Patent: Dec. 22, 1998

[54] METHOD FOR PRODUCING FERROELECTRIC FILM ELEMENT, AND FERROELECTRIC FILM ELEMENT AND FERROELECTRIC MEMORY ELEMENT PRODUCED BY THE METHOD

[75] Inventors: Maho Ushikubo; Yasuyuki Ito; Seiichi Yokoyama, all of Kashiwa; Hironori Matsunaga, Noda; Masayoshi Koba, Nara, all of Japan

[73] Assignee: Sharp Kabushiki Kaisha, Osaka, Japan

[21] Appl. No.: 713,651

[22] Filed: Sep. 13, 1996

[30] Foreign Application Priority Data

Sep. 26, 1995 [JP] Japan .................................. 7-247509
Feb. 23, 1996 [JP] Japan .................................. 8-036041

[51] Int. Cl.$^6$ ............................ H01L 21/70; H01L 27/00
[52] U.S. Cl. ............................ 437/60; 437/919; 437/247
[58] Field of Search ................................ 437/52, 60, 919, 437/47, 247; 147/DIG. 14

[56] References Cited

U.S. PATENT DOCUMENTS

| | | | |
|---|---|---|---|
| 5,005,102 | 4/1991 | Larson | 361/313 |
| 5,053,917 | 10/1991 | Miyasaka et al. | 361/321 |
| 5,335,138 | 8/1994 | Sandhu et al. | 437/60 |
| 5,548,475 | 8/1996 | Ushikubo et al. | |

FOREIGN PATENT DOCUMENTS

| | | |
|---|---|---|
| 3 108 192 | 5/1991 | Japan . |
| 3 108 770 | 5/1991 | Japan . |
| 5 235 268 | 9/1993 | Japan . |
| WO 93/12538 | 6/1993 | WIPO . |
| WO 94/10702 | 5/1994 | WIPO . |

OTHER PUBLICATIONS

G.A. Smolenskii et al., Soviet Phys. Solid State, A New Group of Ferroelectrics, 1, 149, 1959.

E.C. Subbarao, J. Phys. Chem. Solids, A Family of Ferroelectric Bismuth Compounds, 23, 665, 1962.

S. Onishi et al., IEEE IEDM Technical Digest, A Half–Micron Ferroelectric Memory Cell . . . , p. 843, 1994.

Extended Abstracts, The Japan Society of Applied Physics, The 55th Autumn Meeting, 1994 (20p–M–19).

H. Matsunaga et al., Chemical Abstracts 124:248134 (1996).

Extended Abstracts, The Japan Society of Applied Physics, The 55th Spring Meeting, 1995 (29p–D–2).

Extended Abstracts, The Japan Society of Applied Physics, The 42nd Spring Meeting, 1995 (29p–D–3).

Extended Abstracts, The Japan Society of Applied Physics, The 56th Autumn Meeting, 1995 (27a–ZG–3).

Extended Abstracts, The Japan Society of Applied Physics, The 43rd Spring Meeting, 1996 (28p–V–11).

Takashi Nakamura et al., Jpn. J. Appl. Phys., Preparation of C–Axis–Oriented . . . , vol. 32, (1993), pp. 4086–4088 Part 1, No. 9b, Sep. 1993.

T. Kijima et al., Extended Abstracts of the 1995 Interntaional Conference on Solid State Devices and Materials, Osaka, 1995, pp. 1071–1072.

T. Kijima et al., Jpn. J. Appl. Phys., Ultra–Thin Fatigue–Free . . . , vol. 35 (1996), pp. 1246–1250, Part 1, No. 2B, Feb. 1996.

(List continued on next page.)

Primary Examiner—Jey Tsai
Attorney, Agent, or Firm—Birch, Stewart, Kolasch & Birch, LLP

[57] ABSTRACT

A method for producing a ferroelectric element having a lower electrode layer, a ferroelectric film and an upper electrode layer provided in sequence on the substrate is disclosed. The method comprising the step of applying a metal-contained precursor solution to the surface of the lower electrode layer formed on the substrate, the step of drying the applied precursor solution to remove the solution alone by heating it, a first heat treatment step for heating the dried precursor to form a ferroelectric film, and a second heat treatment step for heating the formed film element in a gas-pressurized atmosphere of lower than 1 atmosphere after forming an upper electrode layer on the ferroelectric film.

5 Claims, 20 Drawing Sheets

OTHER PUBLICATIONS

Kuniaki Yoshimura et al., Journals of the Ceramic Society of Japan, Prepration of Bi4Ti3O12 . . . , 102, [5], pp. 512–515 (1994).

Takashi Nakamura, Integrated Ferroelectrics, Preparation of $Bi_4Ti_3O_{12}$ Films . . . , vol. 6, pp. 35–46 (1995).

Takashi Nakamura et al., Jpn. J. Appl. Phys., Preparation of C–Axis–Oriented $Bi_4Ti_3O_{12}$ Thin Films . . . , vol. 32, pp. 4086–4088 (1993).

Takashi Kijima et al., Jpn. J. Appl. Phys. Ultra–Thin Fatigue–Free . . . , vol. 35, pp. 1246–1250 (1996).

METHOD FOR PRODUCING FERROELECTRIC FILM ELEMENT, AND FERROELECTRIC FILM ELEMENT AND FERROELECTRIC MEMORY ELEMENT PRODUCED BY THE METHOD

BACKGROUND OF THE INVENTION

1. Field of the Invention

The present invention relates to a method for producing a ferroelectric film element to be used for memory elements, pyroelectric sensor elements, piezoelectric element and the like, and also relates to a ferroelectric film element and a ferroelectric memory element produced by the method.

2. Description of the Related Art

Ferroelectric films are applied to a wide variety of device developments, since they have many functions such as spontaneous polarization, high ferroelectricity, electro-optical effect, piezoelectric effect and pyroelectric effect. They are employed in various fields, for example, for IR linear array sensors by utilizing their pyroelectricity, for ultrasonic sensors by utilizing their piezoelectricity, for waveguide type optical modulator by utilizing their electro-optical effect and for DRAM or capacitors for MMIC by utilizing their high ferroelectricity.

With a recent progress of film formation technique, development of ferroelectric nonvolatile memories (FRAM) having a high density and operating at high speed by combination with the semiconductor memory technique are successful among those wide developments of applied devices. Owing to their characteristics such as high-speed read/write, low-voltage operation and high read/write resistivity, nonvolatile memories using ferroelectric films are undergoing a vivid research and development for practical use as memories substitutable not only to conventional nonvolatile memories but also to SRAM or DRAM.

For development of such devices, a material with a large remanent polarization (Pr), a small coercive field (Ec), a low leakage current and a high repetition resistivity of polarization reversals is necessary. Furthermore, to adjust a reduction in operating voltage and fine machining process of a semiconductor, the above characteristics is desired to be implemented in a film, 200 nm thick or less.

As ferroelectric materials for these applications, oxide materials of perovskite structure represented by PZT (lead zirconium titanate, Pb (Ti, Zr) $O_3$) are mainly used. However, there is a problem with materials containing lead as their component element such as PZT, that the lead is evaporated when forming the film because of high evaporation pressure of lead or its oxide, so that defects take place in the film or in the worst case pinholes are formed. Consequently, they had a fault that the leakage current increased and further repetition of polarization reversals led to fatigue phenomena such a decrease in the magnitude of spontaneous polarization. In particular, if a substitution of ferroelectric nonvolatile memories for FRAM is considered, no change in characteristics even after $10^{15}$ times of polarization reversals must be ensured concerning fatigue phenomena and therefore development of ferroelectric films free from fatigue has been desired.

In this conjunction, research and development of bismuth layer-structured composition materials has recently been carried out. Bismuth layer-structured composition materials were discovered in 1959 by Smolenskii and others (G. A. Smolenskii, V. A. Isupov and A. I. Agranovskaya, Soviet Phys. Solid State, 1, 149, (1959)) and thereafter were examined in detail by Subbarao (E. C. Subbarao, J. Phys,. Chem. Solids, 23, 665 (1962)). Lately, Carlos A. Paz de Araujo and others found out that this bismuth layer-structured composition is suitable for the application to ferroelectric and high-dielectric integrated circuits and reported a superior fatigue property that no change in characteristics were observed in particular even after $10^{12}$ times or more of polarization reversals (International Application No. PCT/US92/10542).

On the other hand, as methods for producing ferroelectric films, physical methods such as vacuum deposition method, sputtering method and laser ablation method and chemical methods such as sol-gel method or MOD (Metal Organic Decomposition) method for using organometallic compositions as initial raw materials and obtaining an oxide ferroelectric by pyrolysis of them and MOCVD (Metal Organic Chemical vapor Deposition) are employed.

Among the above-mentioned film forming methods, the sol-gel method or MOD method is widely applied from the viewpoint of advantages that a homogeneous mixing at the atomic level is possible, the reproducibility is excellent with easy control of composition, forming of a large-area film is possible without need for a special vacuum device under normal pressures and cost is industrially low.

In particular, as film forming method of the above bismuth layer-structured film, the MOD method is employed. With a film forming process in accordance with the conventional MOD method, ferroelectric films or dielectric films are produced in the following steps (International Application No. PCT/US92/10542, PCT/US93/10021).

1) The step of applying a precursor solution comprising composite alkysid or the like onto the substrate by the spin coat method for film forming.
2) The process of heating and drying the obtained film for 30 sec. to several min. at 150° C. to remove the solvent or the alcohols and distillate moisture reactively formed in the step 1) from the film.
3) The process of heat treatment at 725° C. for 30 sec. by using the RTA (Rapid Thermal Annealing) method in the oxygen atmosphere to remove the organic components in the film by pyrolysis.
4) The process of heat treatment at 800° C. for an hour in the oxygen atmosphere to crystallize the film.
5) The process of heat treatment at 800° C. for 30 sec in the oxygen atmosphere after the formation of the upper electrode.
6) Still further, to obtain a desired film thickness, the steps of 1) to 3) are repeated and finally the steps of 4) and 5a) are executed.

In this manner, ferroelectric films or dielectric films can be produced.

In the above-mentioned method for producing a ferroelectric film by using a conventional MOD method, however, ferroelectric films obtained by the step of crystallization prior to the formation of the upper electrode (step 4) are hardly crystallized at annealing temperatures of 650° C. or lower and had to be treated by heating at an extreme high temperature of 800° C. for as long a time as an hour to obtain a high remanent polarized value (International Application No. PCT/US93/10021). Accordingly, the obtained film became a coarse-structured film with the grain size on the order of about 2000 Å and the insulating resistance decreased with increasing leakage current, thereby making the fine machining more difficult, and therefore the conventional MOD method was not fit for the highly integration.

In addition, with a conventional MOD method, since there were problems such as occurrence of cracks when the film thickness obtained at one time of spin coat is set at about 1000 Å or thicker, the concentration of the precursor solution was so regulated that the film thickness obtained became 1000 Å or thinner. Accordingly, to obtain the film thickness of about 2000 Å, several times of applying steps became necessary and a heat treatment with RTA was required for each time of application using a spin coater, which facts were extremely nonproductive in the production process of elements.

On the other hand, for highly integration of ferroelectric nonvolatile memories, it is required to adopt a stack type structure in which a selective transistor and a ferroelectric capacitor are connected by a contact plug and a ferroelectric capacitor is formed on the contact plug (S. Onishi et al., IEEE IEDM Technical Digest, p843 (1994)). However, a high-temperature and long-time heat treatment in the oxygen atmosphere for forming a ferroelectric film has problems that mutual diffusion on the interface between a ferroelectric film and an electrode, oxidation of contact materials such as polysilicon, mutual diffusion between a contact plug material and a lower electrode material or a ferroelectric film and the like cause contact faults or property deterioration. Accordingly, it is required to thickly form an electrode material or a barrier metal material resistant to high temperatures for a long time, but this leads to an increase in the step difference of the capacitor part, thereby forming a hindrance against a highly integration of elements. Thus, to achieve a highly integration by reducing the film thickness of the whole capacitor, the ferroelectric film is desirous to a better characteristic by the heat treatment of even a little lower temperature than is conventional. As a measure of this achievement, it is necessary that the heat treatment temperature of a ferroelectric film is 650° C. or lower.

SUMMARY OF THE INVENTION

An object of the present invention is to provide a method for solve the above problems and thereby to produce a ferroelectric element with a lower film forming temperature and a simple production process than those in the conventional method for producing ferroelectric film elements.

Another object of the present invention is to provide a ferroelectric film element of fine-structured films and reduced leakage current produced by said producing method.

Still another object of the present invention is to provide a ferroelectric memory element having the stack type structure.

The object of the invention can be achieved by a method for producing a ferroelectric element compring the steps of: forming a lower electrode layer on a substrate; applying a metal-contained precursor solution to the surface of said lower electrode; drying said precursor solution applied to the surface so as to remove only said solution by heating; a first heat treatment for heating the dried precursor to form a ferroelectric film; forming an upper electrode layer on said ferroelectric film; and a second heat treatment for heating the formed film element in a gas-pressurized atmosphere of lower than 1 atmosphere.

Preferably, the gas pressure in the atmosphere of the second heat treatment step is equal to or lower than 20.

More preferably, the gas pressure in the atmosphere of the second heat treatment step is within a range from 2 Torr to 20 Torr.

Preferably, the heating temperature of the second heat treatment is within a range from 500° C. to 650° C.

Preferably, the precursor solution comprises a metal carboxyl and an alkoxid.

The another object of the invention can be achieved by a ferroelectric film elements having a lower electrode layer, a ferroelectric film and an upper electrode layer provided in sequence on a substrate, wherein the ferroelectric film is composed of a bismuth layer-structured composition with the maximum crystal grain size of not greater than 700 Å.

The still another object of the present invention can be achieved by a ferroelectric memory element including one switching transistor and one ferroelectric capacitor, having a stack structure, comprising: a semiconductor substrate; a first insulator film covering said semiconductor substrate on which said switching transistor is formed; a contact plug piercing said first insulator film and internally filled with conductive substance; a lower electrode formed on said contact plug; a ferroelectric film formed on said lower electrode being composed of a bismuth layer-structured composition; and an upper electrode formed on said ferroelectric film.

Preferably, the bismuth layer-structured compound forming a ferroelectric film is a compound containing Sr and Bi, and at least one of Ta and Ti.

As mentioned above, in the method for producing a ferroelectric film element employing the sol-gel method and the MOD method according to the present invention, after applying a precursor solution comprising component elements of a ferroelectric film material to the substrate and drying, the conventional RTA heat treatment step for removing the organic component in the film is omitted and the application drying step is repeated at several times to form a predetermined film thickness, then organic substances are removed by pyrolysis in a first heat treatment step and at the same time crystallization is carried out. And as a second heat treatment step after the formation of an upper electrode layer on this heat-treated film, the ferroelectric film is crystallized by drying for a sufficient time in the atmosphere of gas pressure at 1 atm or lower.

According to the present invention, the temperature for forming a file can be lowered as compared with a conventional producing method.

Further, a film produced by the method becomes a fine-structured film of small grain size, so that a quite excellent ferroelectric film exhibiting a small leakage current, a high insulation resistance and the like.

Further objects and advantages of the present invention will be apparent from the following description of the preferred embodiments of the invention as illustrated in the accompanying drawings.

Figure 20:
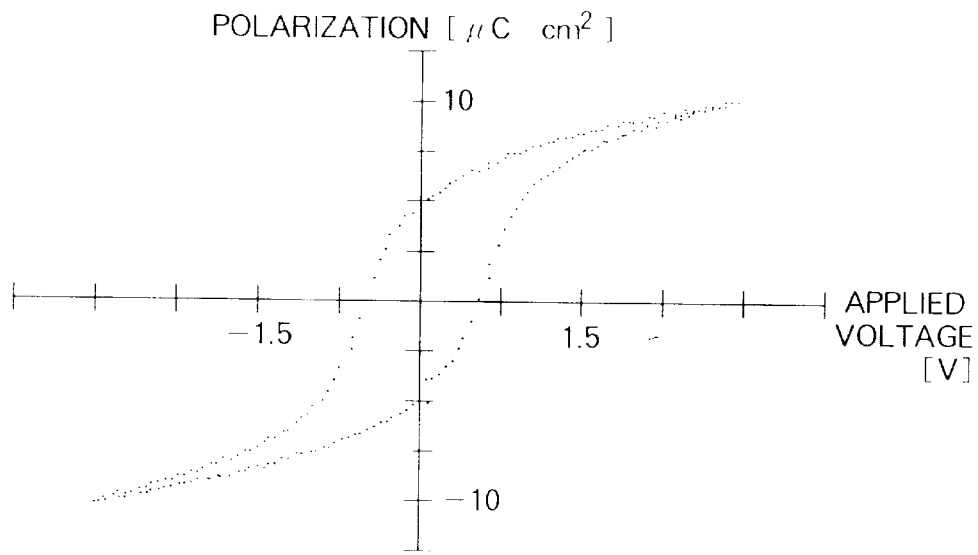
Figure 21:
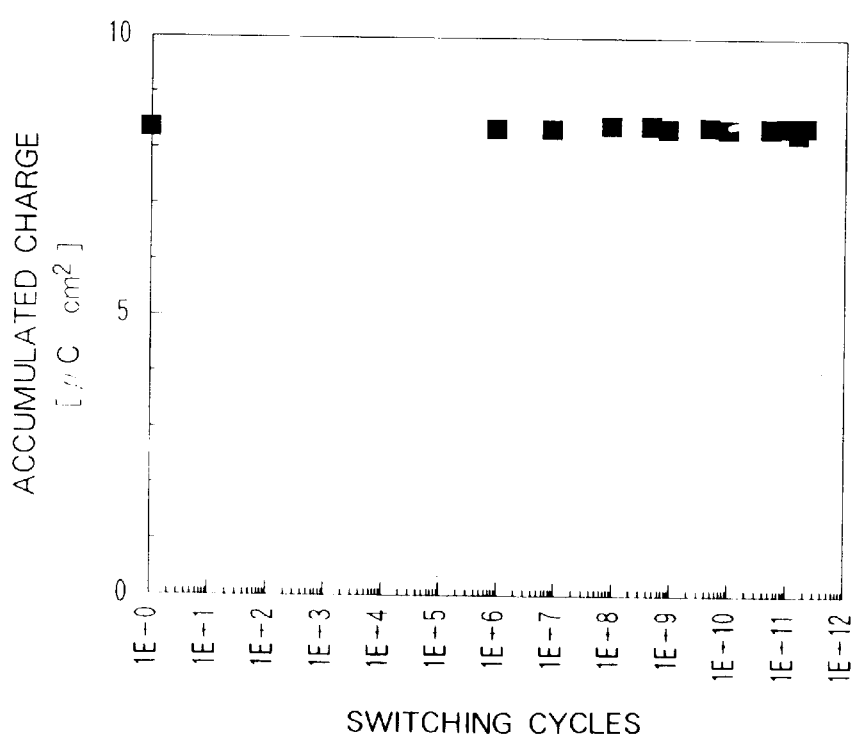
Figure 22:
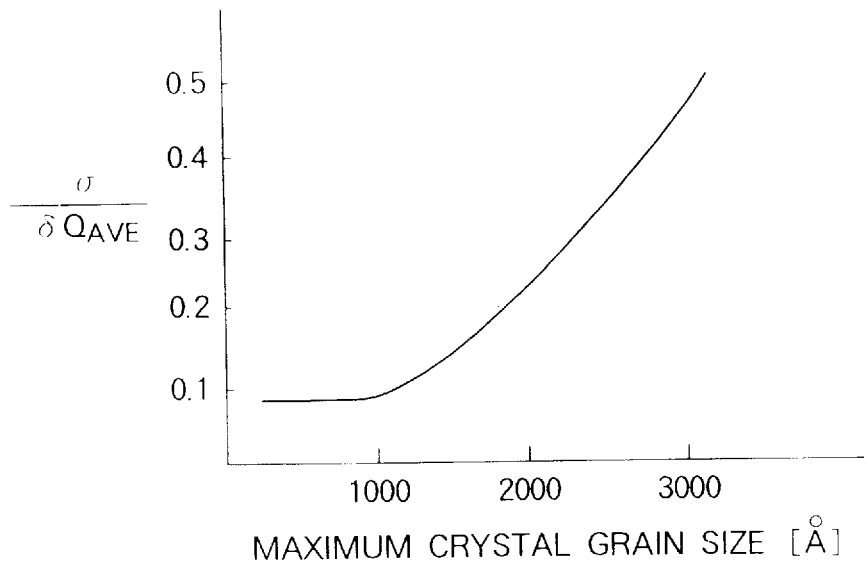
Figure 23:
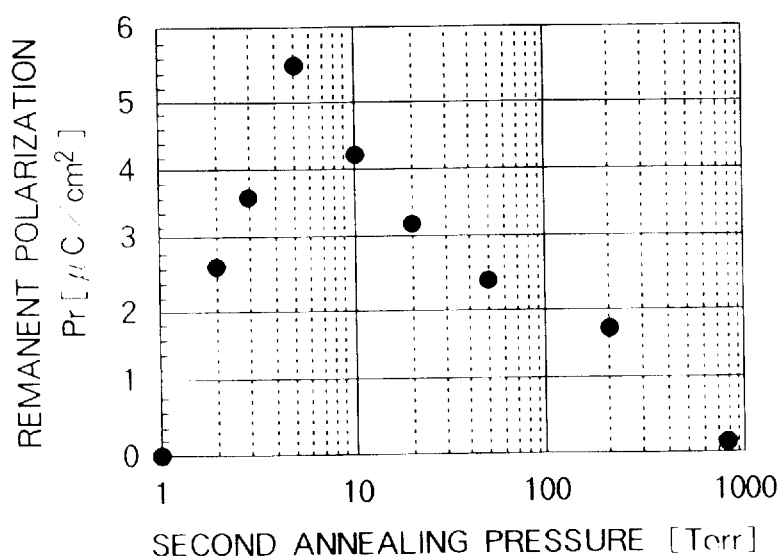
Figure 24:
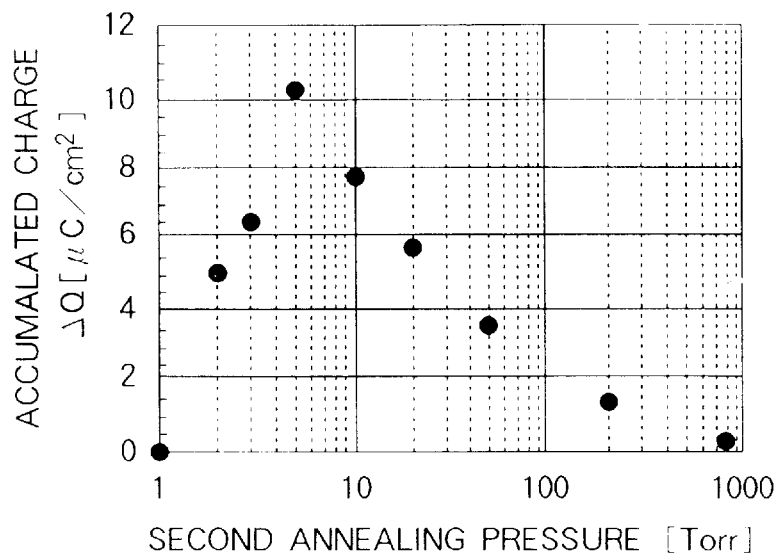
Figure 25:
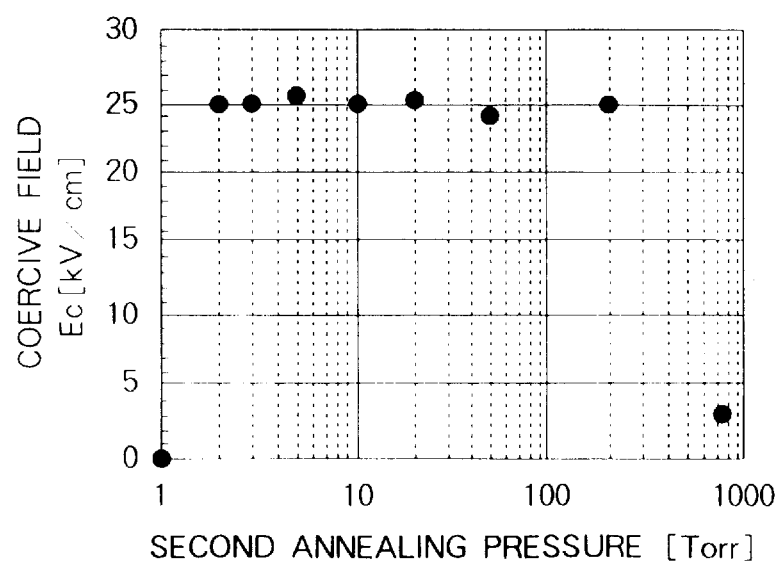
Figure 26:
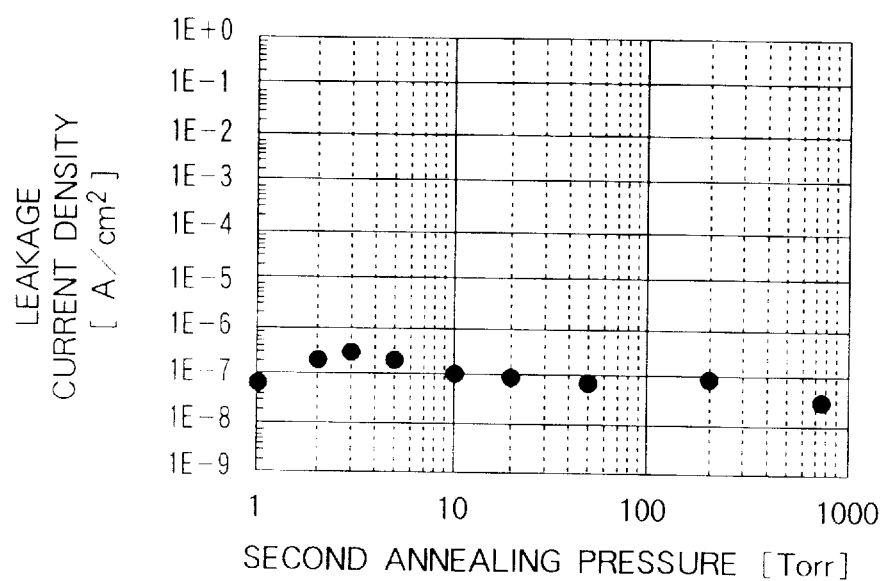
Figure 27:
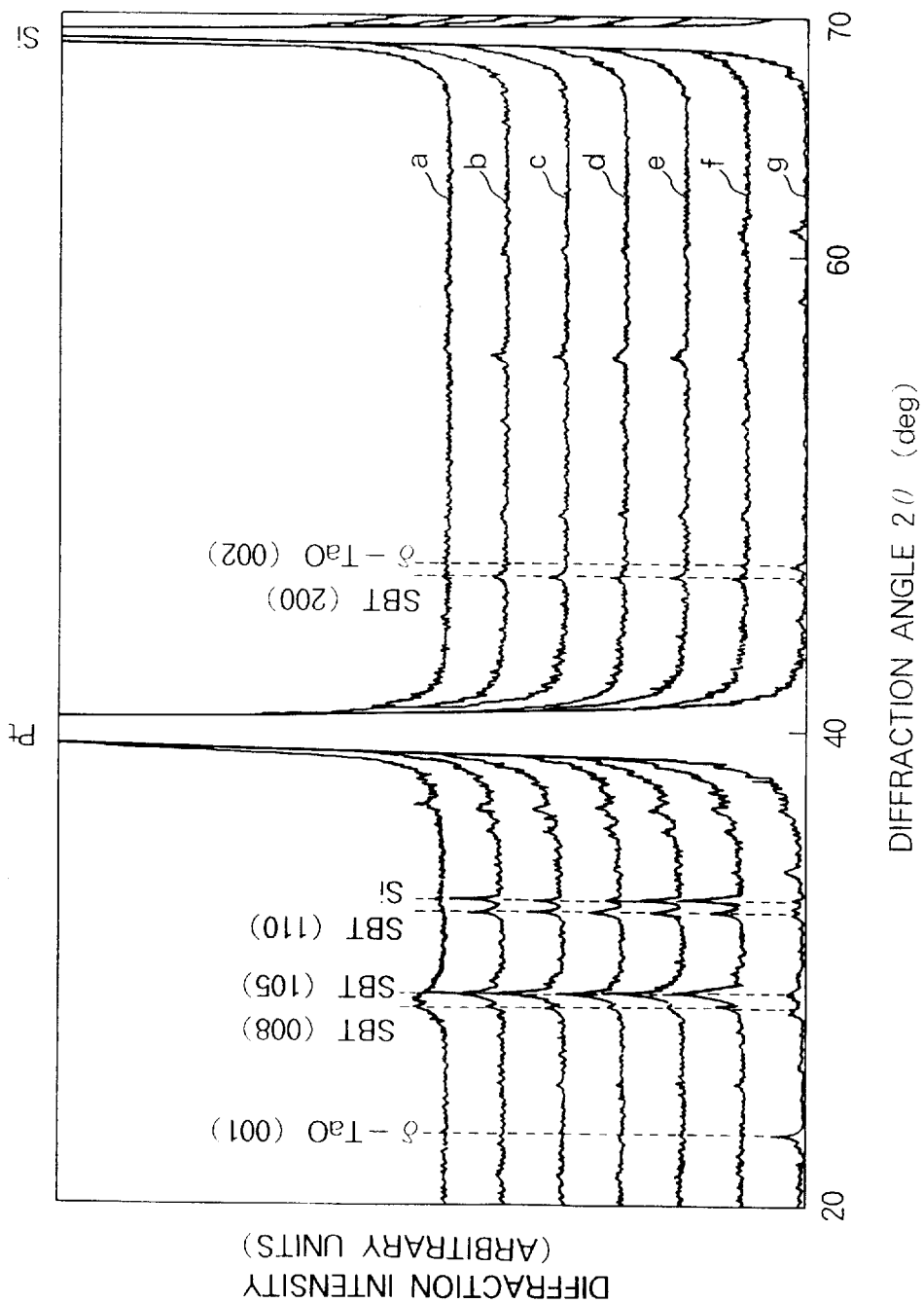
Figure 28:
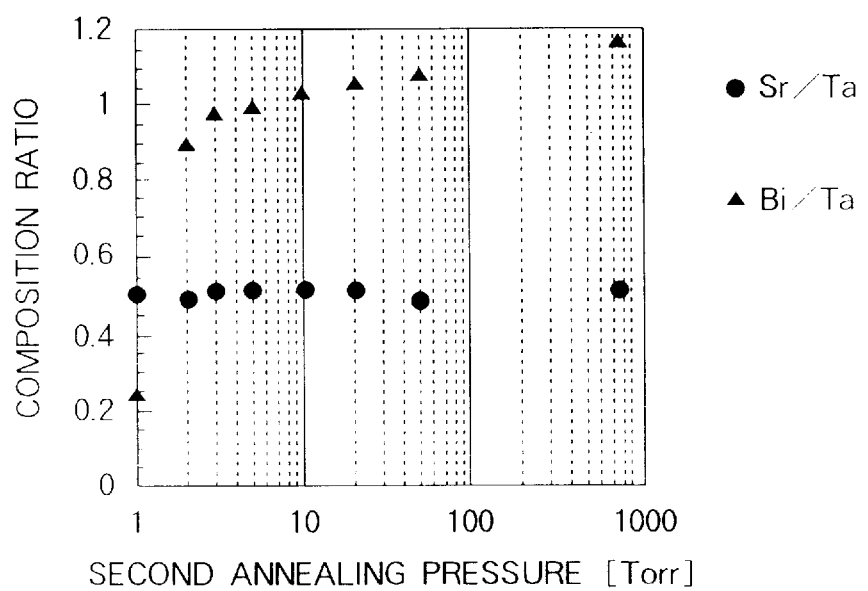

Each of FIGS. 19a to 19d is a sectional view showing a part of the producing steps of the second embodiment;

FIG. 20 is a graph showing a hysteresis loop under voltage application of 3 V to the second embodiment;

FIG. 21 is a graph showing a fatigue property of the second embodiment;

FIG. 22 is a graph showing a change in a value of standard variation (δ) of the accumulated charge δQ divided by the average ($\delta Q_{AVE}$) of the accumulated charge δQ relative to the maximum crystal grain size of the ferroelectric film in a third embodiment according to the present invention;

FIG. 23 is a graph showing a change in the remanent polarization Pr of a film relative to the atmospheric gas pressure of a second annealing (a second annealing pressure) of a fourth embodiment of ferroelectric film element according to the present invention;

FIG. 24 is a graph showing a change in accumulated charge δQ relative to the atmospheric gas pressure of a second annealing (a second annealing pressure) of the fourth embodiment;

FIG. 25 is a graph showing a change in coercive field Ec relative to the atmospheric gas pressure of a second annealing (a second annealing pressure) of the fourth embodiment;

FIG. 26 is a graph showing a change in leakage current density under voltage application of 3 V relative to the atmospheric gas pressure of a second annealing (a second annealing pressure) of the fourth embodiment;

FIG. 27 is an X-ray diffraction pattern of a film relative to the atmospheric gas pressure of a second annealing (a second annealing pressure) of the SBT film in the fourth embodiment; and FIG. 28 is a graph showing a change in film composition ratio relative to the atmospheric gas pressure of a second annealing (a second annealing pressure) of the SBT film in the fourth embodiment.

DESCRIPTION OF THE PREFERRED EMBODIMENTS

Hereinafter, embodiments according to the present invention will be described referring to the drawings.

Figure 1:
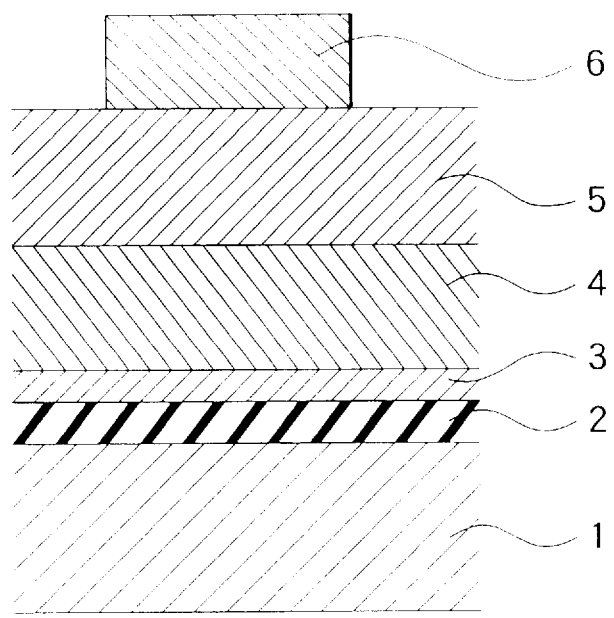
FIG. 1 is a sectional view of a ferroelectric film element of a first embodiment according to the present invention.

FIG. 1 is a sectional view of construction of ferroelectric film element of a first embodiment by producing method for ferroelectric film according to the present invention. With this ferroelectric film element, a 200 nm thick silicon thermo-oxide film 2 is formed on the surface of the n-type silicon substrate 1, on which film 2 a 30 nm thick Ta film 3, a 200 nm thick Pt film 4, a 200 nm thick ferroelectric $SrBi_2Ta_2O_9$ film (hereinafter, referred to as SBT film) 5 and a 100 thick Pt upper electrode 6 are formed in sequence as shown in FIG. 1. Incidentally, here, the silicon thermo-oxide film 2 is provided as inter-layer insulating film, but the film is not limited to this. In addition, the Pt film 4 is chosen as a hardly oxidizable electrode material because an oxide film is formed on it and a conductive oxide film such as $RuO_2$, but $IrO_2$ may be employed instead. And, the Ta film 3 is employed under consideration of adherence between the silicon thermo-oxide film 2 and the Pt film 4, but a Ti film or a TiN film may be employed instead.

Next, a producing method for ferroelectric film element shown in FIG. 1 will be described.

First, on the surface of the n-type silicon substrate 1, a 200 nm thick silicon thermo-oxide film 2 is formed. Incidentally, according to the formation method for a silicon thermo-oxide film in this embodiment, formation is made by thermally oxidizing the surface of the n-type silicon substrate 1 at 1000° C. And on this silicon thermo-oxide film 2, a 30 nm thick Ta film 3 is formed by the sputtering method and further on this a 200 nm Pt film 4 is formed and this will be employed as a ferroelectric-film formed substrate.

Figure 2:
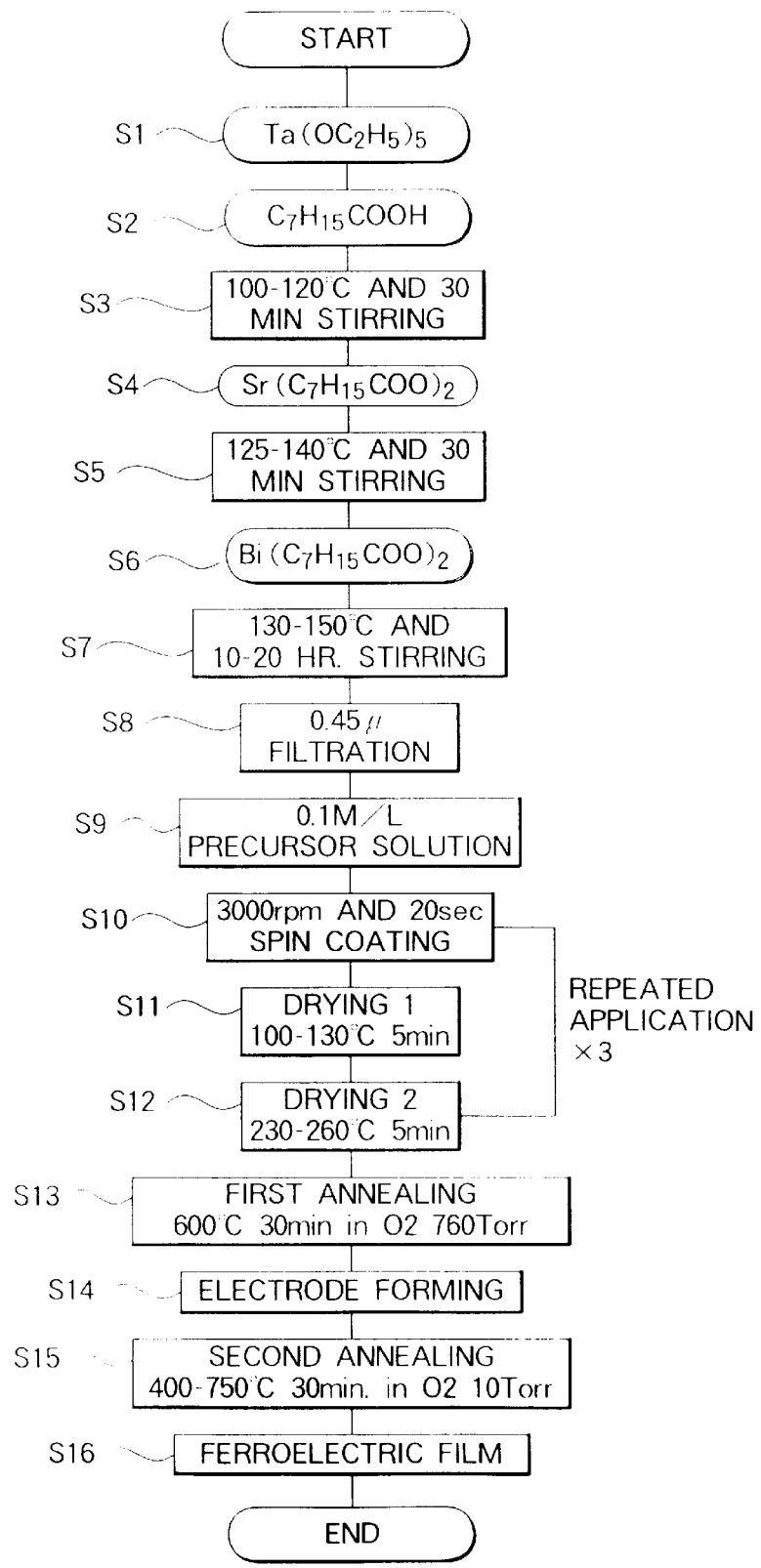
FIG. 2 is a process chart showing a part of the producing steps of the first embodoment.

Hereinafter, a synthesis method for a precursor solution employed to form an SBT film 5 on this substrate and the step of forming the SBT film as a ferroelectric film on the substrate by using this precursor solution will be described referring to the process chart of FIG. 2.

As initial raw materials for the synthesis of a precursor solution, tantalum ethoxide (Ta $(OC_2H_5)_5$), bismuth-2-ethylhexanate (Bi $(C_7H_{15}COO)_2$) and strontium-2-ethylhexanate (Sr $(C_7H_{15}COO)_2$) are employed. Tantalum ethoxide is weighed (Step S1) and dissolved into 2-ethylhexanate (Step S2). To stipulate the reaction, the solution is stirred while heating from 100° C. to a maximum temperature of 120° C. and allowed to undergo a reaction for 30 min (Step S3). Then, the ethanol and water produced by the reaction are removed at 120° C. To this solution, strontium-2-ethylhexanate dissolved in 20 ml–30 ml of xylene is added to the solution in so adequate an amount that Sr/Ta=½(Step S4) and the resultant is stirred at 125° C. to a maximum temperature of 140° C. for 30 min (Step S5). Then, bismuth-2-ethanol dissolved in 10 ml of xylene is added to this solution in so adequate an amount that Sr/Bi/Ta=1/2.4/2 (Step S6) and the resultant is stirred while heating at 130° C. to a maximum temperature of 150° C. for 10 hr. (Step S7).

Next, to remove a low atomic weight of alcohol and water and the xylene used as the solvent from this solution, the solution is distilled at 130° C. to 150° C. for 5 hours. To remove dust from this solution, the solution is filtrated on a 0.45 μm diameter filter (Step S8). Then, the concentration of $SrBi_{2.4}Ta_{2.0}O_{9.6}$ in the solution is regulated to 0.1 mol/1 and this is made to be a precursor solution (Step S9). Incidentally, these raw materials are not limited to the above, but the solvent may be any provided the above initial materials raw materials are sufficiently soluble in it.

Next, using the above precursor solution, film formation will be carried out in the following process: The above precursor solution is dropped onto the substrate including the lower platinum electrode 4 mentioned above and spin-applied at 300 rpm for 20 sec (Step S10). Then, the substrate is laid on a hot plate heated at 120° C. and baked and dried for 5 min in the atmosphere (Step S11). At this time, in order that drying is allowed to proceed uniformly, the temperature range is set preferably at 100° C.–130° C. and the most appropriate drying temperature is on the order of 120° C. This is because occurrence of cracks generated on drying at higher temperatures than this temperature range, e.g., 150° C., is prevented.

Then, to completely volatilize the solvent, the wafer is placed on a hot plate heated at 250° C. and baked and fired (Step S12). This temperature is above the boiling point of the solvent and is preferably on the order of 250° C.–300° C. for a shorter process time. This film forming process is repeated at three times and a 200 nm thick ferroelectric film is formed.

Then, using the RTA method as a first annealing, heat treatment is performed at 600° C. for 30 min in an atmosphere of oxygen under the atmospheric pressure (step S13) and a 200 nm Pt upper electrode 6 is mask-deposited by the EB (Electron Beam) deposition method (step S14). At this first annealing, the pyrolysis removal of the organic substances contained in the applied and dried ferroelectric film is performed. And, simultaneously with the pyrosis removal of organic substances, the ferroelectric film is partly crystallized, which seems to act as a kind of nucleus forming process. Meanwhile, with this embodiment, heat treatment was performed in an atmosphere of oxygen under the atmospheric pressure by using the RTA method, but a normal heat treatment furnace may be employed in place of the RTA method and a mixed gas of oxygen and an inert gas such as nitrogen or argon may be employed as atmosphere gas. In addition, with this embodiment, a 100 μmφ Pt upper electrode was adopted as the electrode size for estimating the characteristics of ferroelectrics, but the present invention is not limited to this electrode size.

Next, after the formation of an upper electrode, a 30 min annealing is performed as a second annealing (principal annealing) in a 10 Torr atmosphere of oxygen at 400° C.–750° C. for 30 min by the RTA method (Step S15). This second annealing is for the purpose of a complete crystallization of ferroelectric films. Meanwhile, with this embodiment, annealing was performed in a 10 Torr atmosphere of oxygen by using the RTA method, but a normal heat treatment furnace may be employed except the RTA method provided heat treatment can be done in an atmosphere of gas pressure below 1 atm. As annealing atmosphere, an inert gas such as nitrogen or argon may be employed and a mixed gas comprising not greater than two sorts of gases out of an inert gas such as nitrogen or argon and oxygen may be employed.

With these steps, the production of a ferroelectric film is completed (Step S16).

Figure 3:
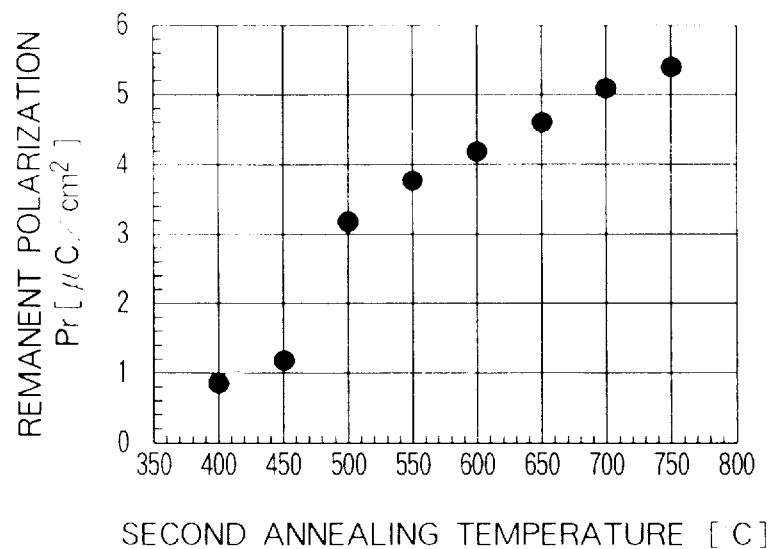
FIG. 3 is a graph showing a change in remanent polarization relative to a second annealing temperature of the first embodiment.
Figure 4:
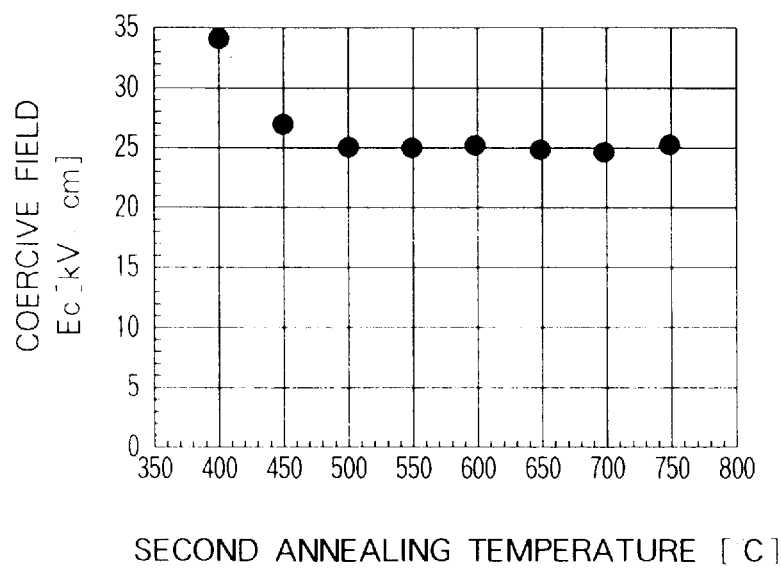
FIG. 4 is a graph showing a change in coercive field Ec relative to a second annealing temperature of the first embodiment.
Figure 5:
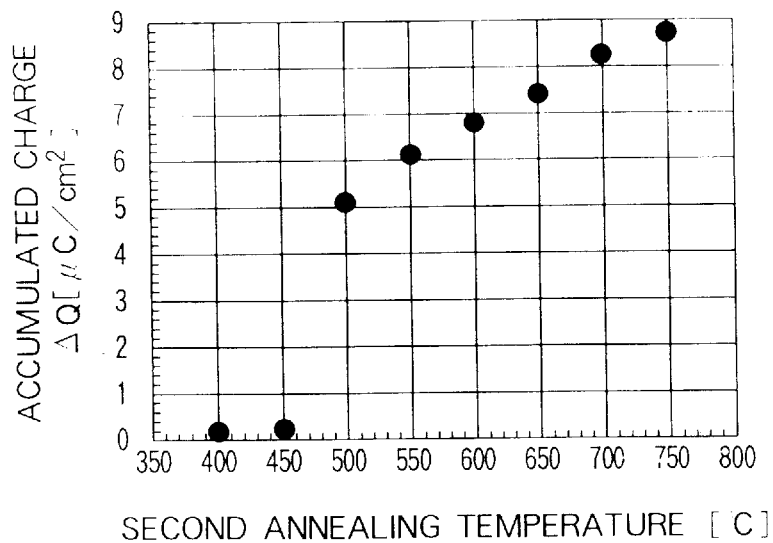
FIG. 5 is a graph showing a change in accumulated charge δQ relative to a second annealing temperature of the first embodiment.

FIGS. 3, 4 and 5 are graphs showing ferroelectric characteristics of the film obtained by the above producing steps relative to a second annealing temperature. Measurements of ferroelectric characteristics were made for a capacitor of the type shown in FIG. 1 with the applied voltage set at 3 V by using a well known Soya Tower circuit.

FIG. 3 is a graph showing a change in the remanent polarization Pr of a film. With lowering of the second annealing temperature, Pr also decreases, but a value of more than 4 $\mu C/cm^2$ is obtained at a second annealing temperature of even 600° C. FIG. 4 is a graph showing a value of coercive field Ec for the film produced by this producing method, Ec is almost constant independent of second annealing temperatures above 500° C. As with Pr shown in FIG. 3, the accumulated charge δQ shown in FIG. 5 increases depending on second annealing temperatures and shows a good characteristic at second annealing temperatures of 500° C. or higher.

Figure 6:
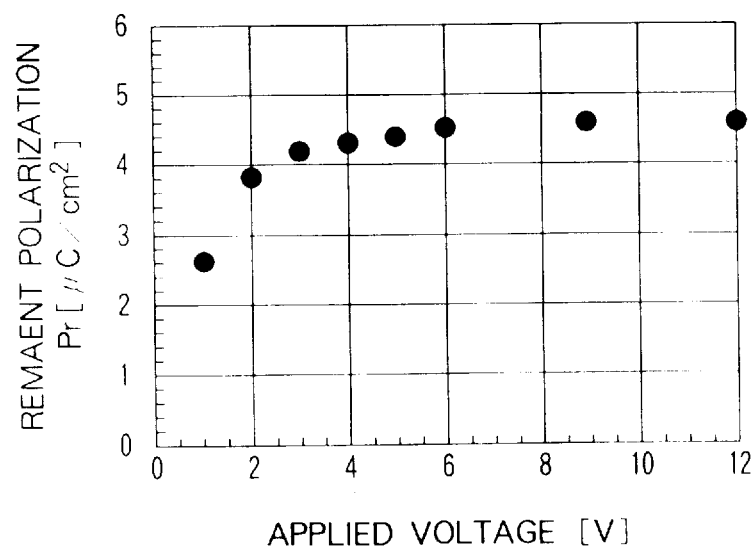
FIG. 6 is a graph showing a change in remanent polarization Pr relative to an applied voltage of the first embodiment.
Figure 7:
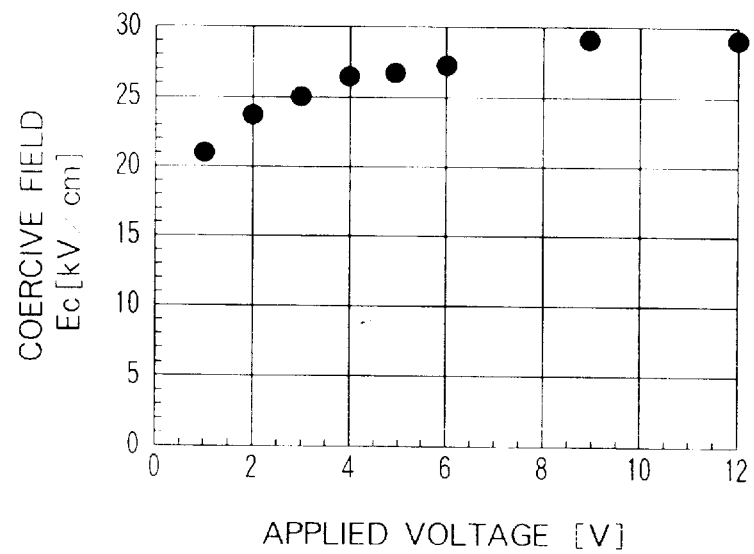
FIG. 7 is a graph showing a change in coercive field Ec relative to an applied voltage of the first embodiment.
Figure 8:
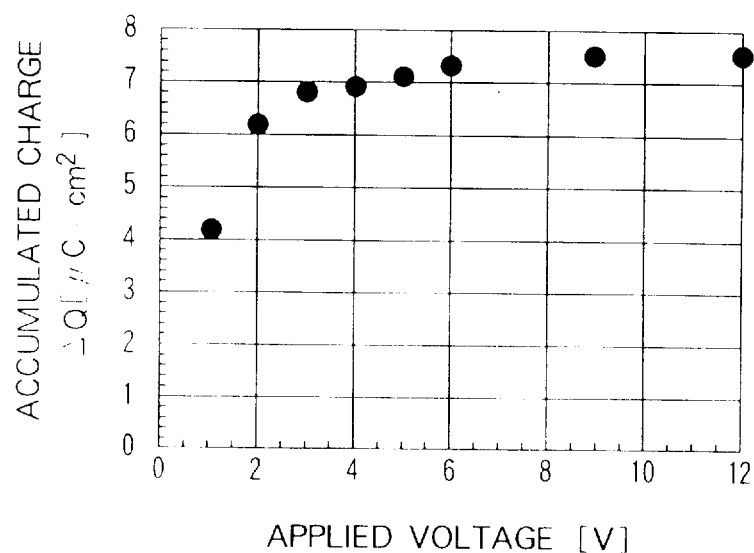
FIG. 8 is a graph showing a change in accumulated charge δQ relative to an applied voltage of the first embodiment.

FIGS. 6, 7 and 8 are graphs showing the applied-voltage dependence of ferroelectric characteristics for cases where a 30 min annealing was made at a first annealing temperature of 600° C. in an atmosphere of oxygen under the atmospheric pressure and the second annealing was performed in a 10 Torr atmosphere of oxygen at 600° C. for 30 min of annealing. These graphs show values of Pr, Ec and δQ respectively for FIGS. 6, 7 and 8 and reveal that Pr, Ec and δQ begin to be saturated upward from the order of 3 V in applied voltage. This shows that constant characteristics are always obtained at applied voltages of not lower than 3 V and the ferroelectric characteristics can be said to be good.

Figure 9:
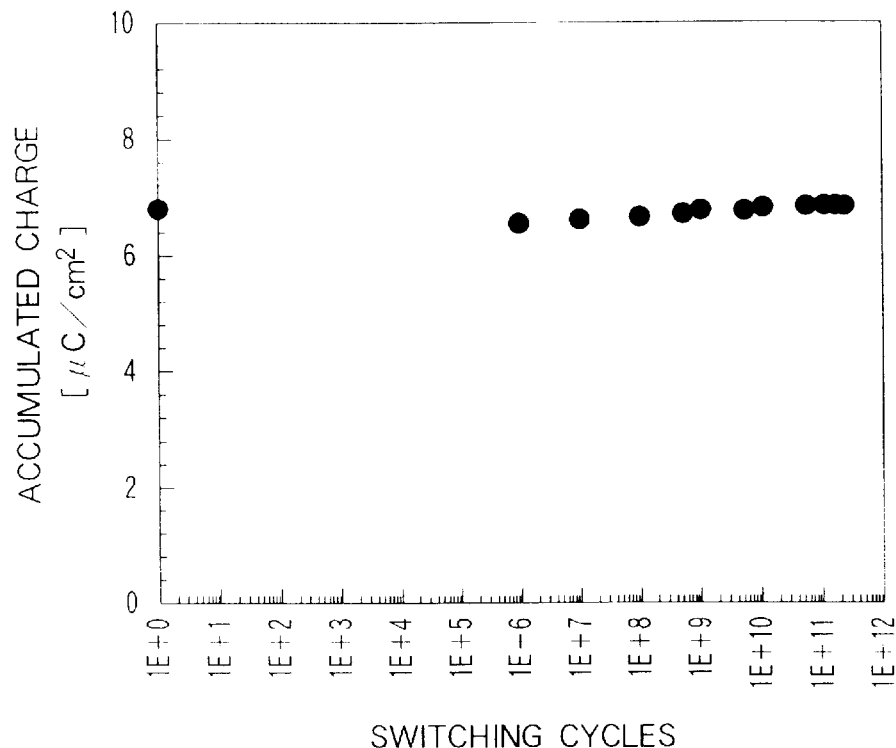
FIG. 9 is a graph showing a fatigue property of the first embodiment.

FIG. 9 is a graph in which a change in accumulated charge δQ relative to number of repeated polarization reversals is plotted for cases where polarization reversals were made under application of a 3 V and 1 MHz pulse to a sample on which a 30 min annealing was performed at a second annealing temperature of 600° C. in an atmosphere of oxygen under the atmospheric pressure and a 30 min annealing was performed at a first annealing temperature of 600° C. in a 10 Torr atmosphere of oxygen. Even after $2 \times 10^{11}$ cycles of polarization reversals, no change whatever is observed in accumulated charge and a good characteristic is indicated in application to a nonvolatile memory.

Figure 10:
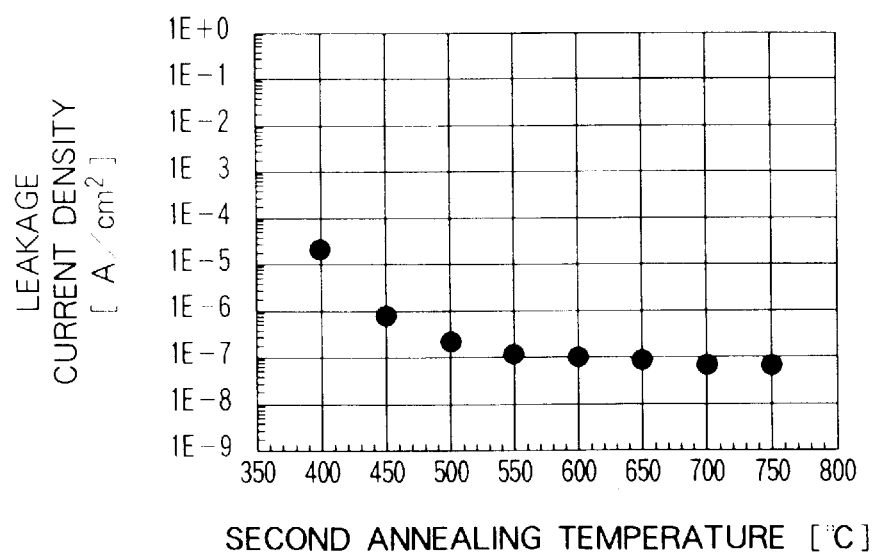
FIG. 10 is a graph showing a change in leakage current density under application of 3 V relative to a second annealing temperature of the first embodiment.

FIG. 10 is a graph showing a change in leakage current density relative to a second annealing temperature under application of 3 V. For 550° C. or higher, a value of $6-9 \times 10^{-8}$ $A/cm^2$ is obtained independently of second annealing temperatures, whereas the leakage current density is large for 500° C. or lower but no such increase in leakage that formerly became at issue for a lower second annealing temperature was observed.

Figure 11:
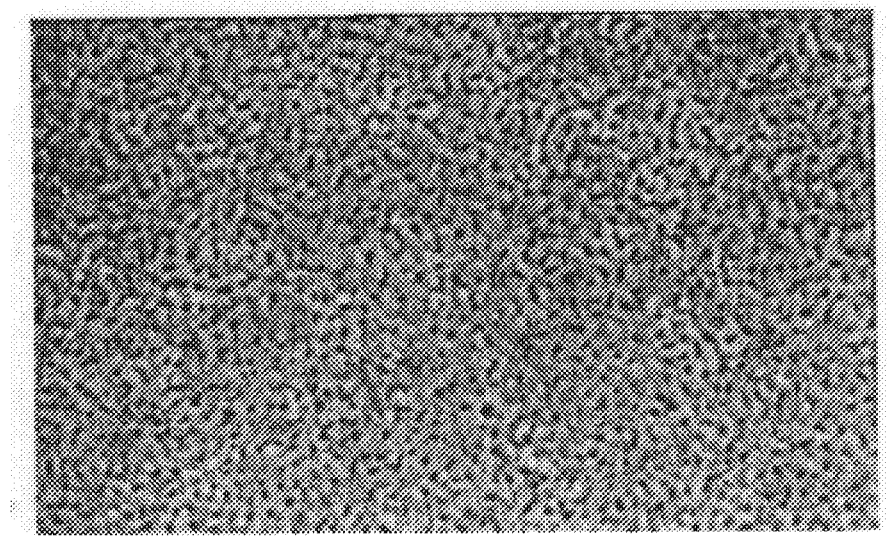
FIG. 11 is a SEM photograph of the surface of a film produced with a first annealing temperature set at 600° C. and a second annealing temperature set at 600° C. in the producing method of FIG. 2.

FIG. 11 is a surface SEM photograph of a film after a 30 min annealing made at a first annealing temperature of 600° C. in an atmosphere of oxygen under the atmospheric pressure and a 30 min annealing made at a second annealing temperature of 600° C. in a 10 Torr atmosphere of oxygen and reveals that the film forms a fine-structured film comprising globular crystal grains of 700 Å or smaller. In addition, also for a second annealing temperature of 650° C., a fine-structured film comprising globular crystal grains of 700 Å or smaller was formed as with a second temperature of 600° C. On the other hand, when a 30 min annealing was made at a first annealing temperature of 600° C. in an atmosphere of oxygen under the atmospheric pressure and a 30 min annealing was made at a second annealing temperature of 700° C. in a 10 Torr atmosphere of oxygen, the SBT film obtained was strap-like and comprised crystal grains of 500–5000 Å size, and still greater crystal grains were obtained for a second annealing temperature of 750° C. than those for a second annealing temperature of 700° C. From these, it is concluded that the maximum crystal grain size of crystal particles constituting the SBT film increases with rising second annealing temperature and a fine-structured film comprising globular crystal grains of 700 Å size or smaller can be formed for second annealing temperatures of 650° C. or lower.

From a result of X-ray diffraction, polycrystals of $SrBi_2Ta_2O_9$ were found for second annealing temperatures of 500° C. or higher, but no clear crystal could be confirmed for second annealing temperatures of 450° C. or higher.

As an example for comparing with the above first embodiment, an SBT film was formed using a conventional producing method and a ferroelectric film element having a structure similar to that of FIG. 1 was produced for estimation of its electric characteristics.

Figure 12:
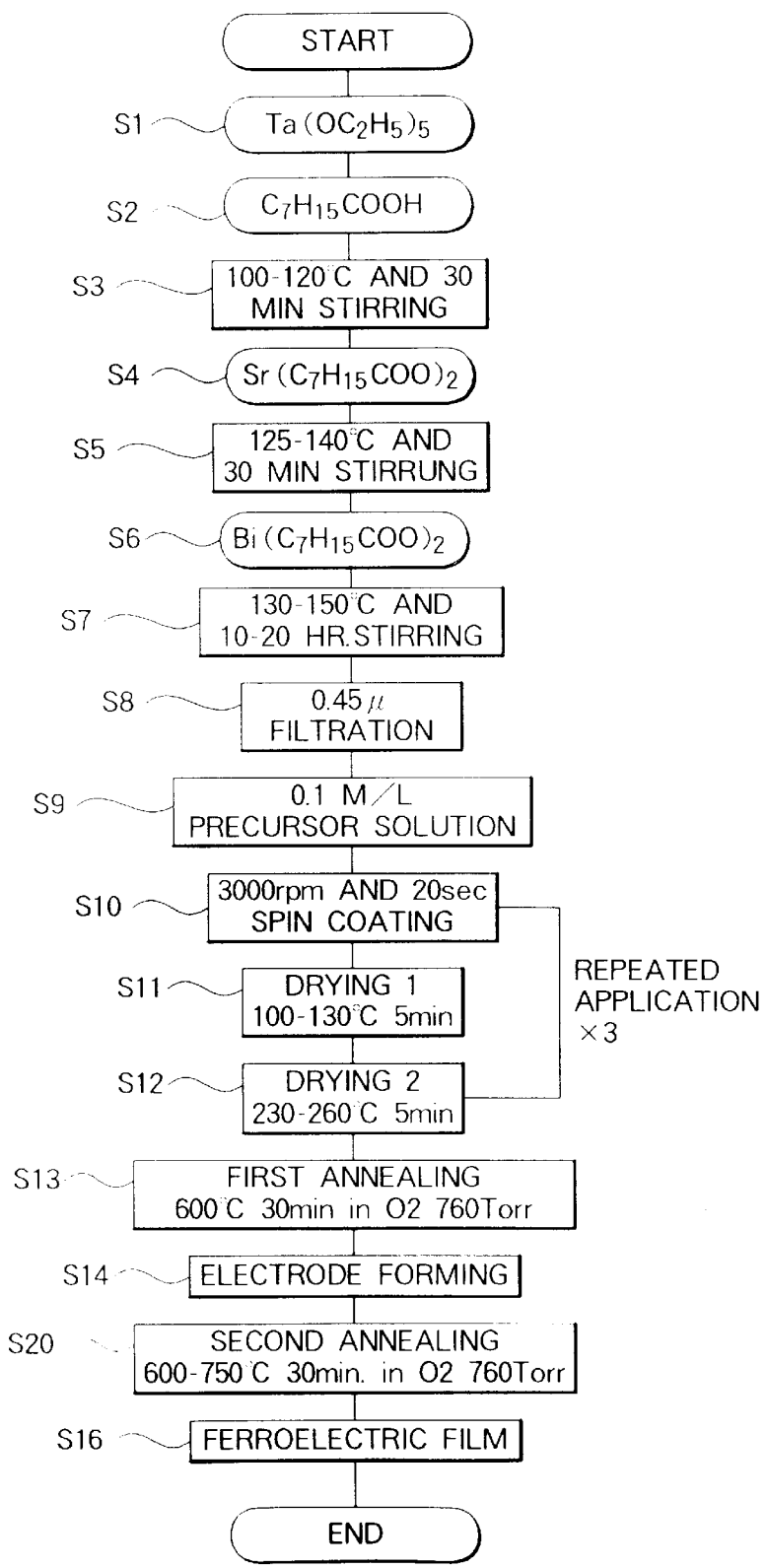
FIG. 12 is a process chart showing a part of the producing steps of a conventional ferroelectric element.

FIG. 12 is a chart showing a synthesis method for a precursor solution used to form an SBT film 5 in the ferroelectric film element shown in FIG. 1 and a conventional process for forming an SBT film as ferroelectric film on the substrate using this precursor solution. To steps similar to those of a first embodiment shown in FIG. 2, the same numbers are attached.

In production of a ferroelectric element for this control, the difference from that of the first embodiment mentioned above lies only in the step of second annealing at the formation of the SBT film. That is, to an SBT film with a 100 $\mu m\phi$ Pt top electrode 6 mask-deposited thereon as with the first embodiment mentioned above, a 600–750° C. and 30 min annealing was performed as the second annealing in an atmosphere of oxygen under the atmospheric pressure by using the RTA method in the control (Step S20).

Figure 13:
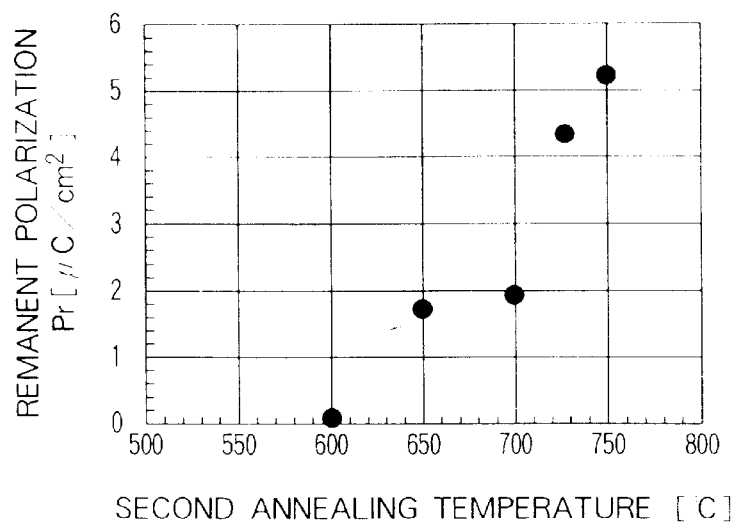
FIG. 13 is a graph showing a change in remanent polarization Pr relative to a second annealing temperature of a conventional ferroelectric element.
Figure 14:
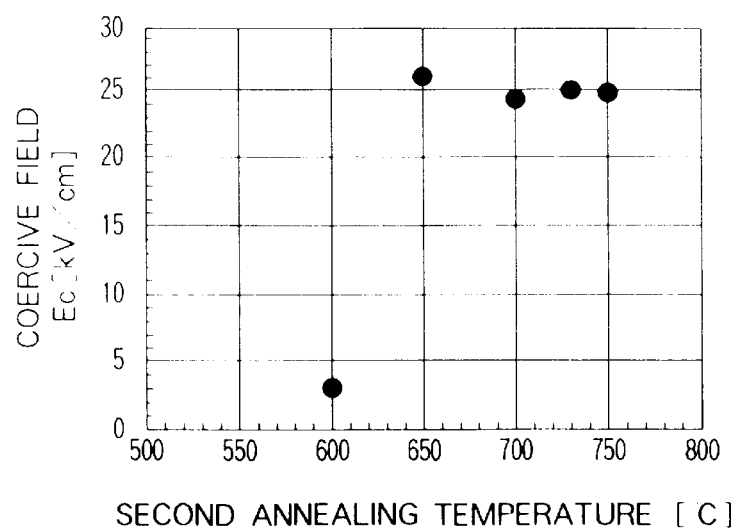
FIG. 14 is a graph showing a change in coercive field Ec relative to a second annealing temperature of a conventional ferroelectric element.
Figure 15:
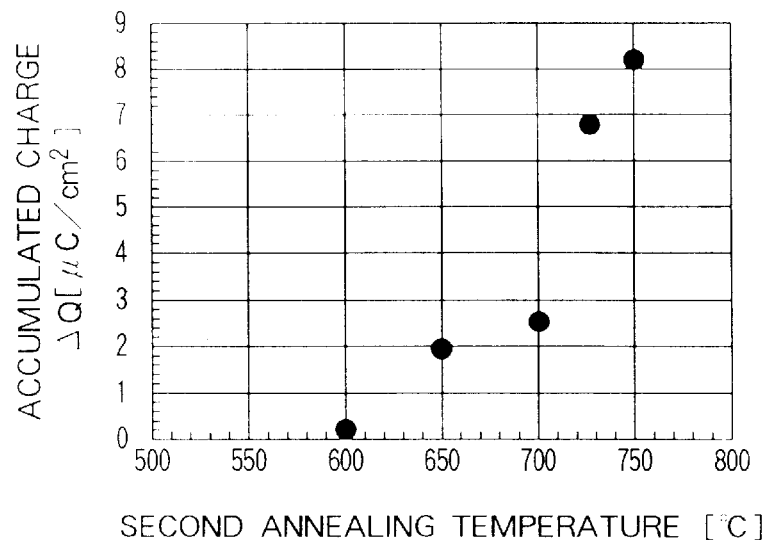
FIG. 15 is a graph showing a change in accumulated charge δQ relative to a second annealing temperature of a conventional ferroelectric element.

FIGS. 13, 14 and 15 are graphs showing ferroelectric characteristics of the film obtained in the process of this control relative to a second annealing temperature. As with the first embodiment mentioned above, measurements of ferroelectric characteristics were made for a capacitor of the type shown in FIG. 1 with the applied voltage set at 3 V by using a well known Soya Tower circuit.

FIG. 13 is a graph showing a change in the remanent polarization Pr of a film. With lowering of the second annealing temperature, a value of Pr abruptly decreased beyond the boundary of 730° C., became very small like 2 $\mu C/cm^2$ or less at 700° C. or lower and hardly any ferroelctricity was exhibited at 600° C. This will be compared with the result of the first embodiment mentioned above. In the first embodiment, it sufficed to obtain a value of Pr not less than 4 $\mu C/cm^2$ that the second annealing temperature is 600° C. (cf. FIG. 3), whereas a value of Pr not less than 4 $\mu C/cm^2$ is found to be not obtainable in the control unless the second annealing temperature is 730° C. or higher. From these, it is clear that lowering of second annealing temperature can be implemented to obtain the equivalent value of Pr in the first embodiment as compared with the control.

FIG. 14 is a graph showing a value of coercive field Ec and Ec exhibits an almost constant value independently of second annealing temperatures at 650° C. or higher. As with Pr shown in FIG. 13, the accumulated charge $\delta Q$ shown in FIG. 15 abruptly decreases for lower second annealing temperatures than the boundary of 730° C.

Figure 16:
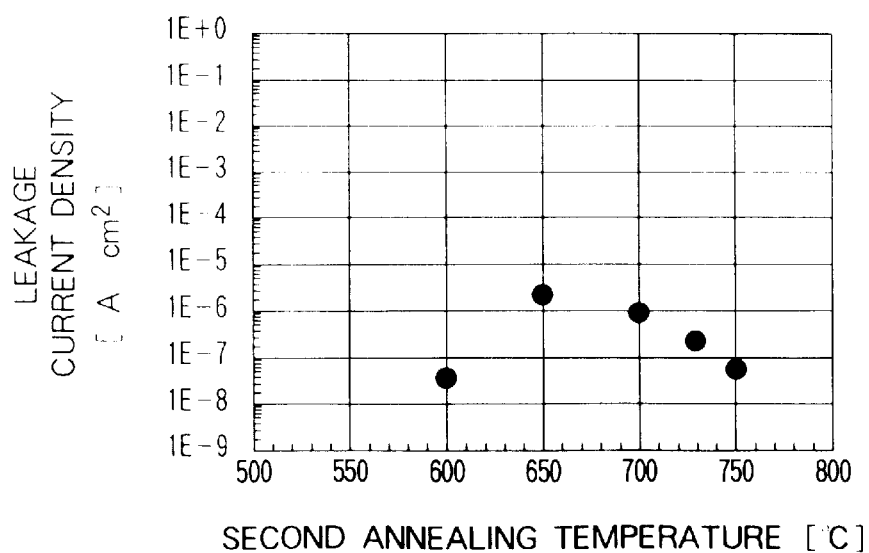
FIG. 16 is a graph showing a change in leakage current density under application of 3 V relative to a second annealing temperature of a conventional ferroelectric element.

FIG. 16 is a graph showing a change in leakage current density relative to second annealing temperatures under application of 3 V. For each decrease of 50° C. in second annealing temperature, the leakage current density increases by one decimal unit and indicates a decreasing tendency at 600° C., but the SBT film of 600° C. exhibits hardly any ferroelectricity.

Figure 17:
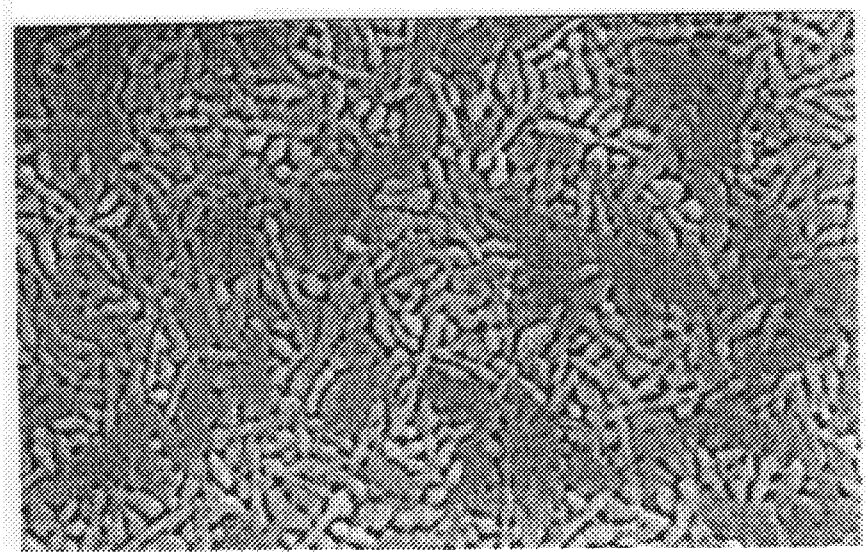
FIG. 17 is a SEM photograph of the surface of a film produced with a first annealing temperature set at 600° C. and a second annealing temperature set at 700° C. in a conventional producing method.

FIG. 17 is a surface SEM photograph of a film after a 30 min annealing made at a first annealing temperature of 600° C. in an atmosphere of oxygen under the atmospheric pressure and a 30 min annealing made at a second annealing temperature of 700° C. in an atmosphere of oxygen under the atmospheric pressure. The SBT film obtained in this case was strap-like and comprised crystal grains of 1500–9000 Å size.

Here, the size of crystal grains will be compared between the first embodiment mentioned above and the control. As mentioned before, in the SBT film for a 30 min annealing made at a first annealing temperature of 600° C. in an atmosphere of oxygen under the atmospheric pressure and a 30 min annealing made at a second annealing temperature of 700° C. in a 10 Torr atmosphere of oxygen, the crystal grain size ranged from 500 Å to 5000 Å, whereas the crystal grain size ranged from 1500 Å to 9000 Å in this control as mentioned above. Smaller crystal grains are obtained for the first embodiment than those of the control. Thus, comparative study of these SBT films differing only in the second annealing temperature reveals that a fine structurization of the film can be achieved by performing a second annealing in the atmosphere of gas pressure not higher than 1 atm.

Next, between the above first embodiment and the control, comparative study will be made of the size of crystal grains in a ferroelectric film that yields a nearly equal value of remanent polarization Pr. In an SBT film according to the above first embodiment for cases where a 30 min annealing was performed at a first annealing temperature of 600° C. in an atmosphere of oxygen under the atmospheric pressure and a 30 min annealing was performed at a second annealing temperature of 600° C. in a 10 Torr atmosphere of oxygen, a value of Pr was about 4.2 $\mu C/cm^2$ as shown in FIG. 3 and crystal grains were 700 Å or smaller in size. On the other hand, as an SBT film yielding a nearly equal value of Pr in the control, there is mentioned a case where a 30 min annealing was made at a first annealing temperature of 600° C. in an atmosphere of oxygen under the atmospheric pressure and a 30 min annealing was made at a second annealing temperature of 730° C. in an atmosphere of oxygen under the atmospheric pressure and a value of Pr=about 4.3 $\mu C/cm^2$ was obtained (cf. FIG. 13). Observation of this SBT film revealed that the size of crystal grains was 1500–9000 Å. From comparison it is found that smaller crystal grains are obtained for the first embodiment than those of the control. From this, it is clear also in comparison of SBT films yielding a nearly equal value of Pr that a fine structurization of the film can be achieved by performing a second annealing in the atmosphere of gas pressure not higher than 1 atm.

The result of X ray diffraction in the control shows that polycrystals of $SrBi_2Ta_2O_9$ was formed for second annealing temperatures of 650° C. or higher but no clear crystallization could not be confirmed for second annealing temperatures of 600° C. or lower.

Like these, in a conventional producing method, an abrupt decrease in values of Pr and $\delta Q$ and an increase in leakage current were observed with lowering second annealing temperature and annealing of 730° C. or higher was required for application to ferroelectric memories. According to the first embodiment of the present invention, however, the second annealing made in an atmosphere of gas pressure not higher than 1 atm permits not only an abrupt increase in values of Pr and $\delta Q$ but also an increase in leakage current to be suppressed. Consequently, sufficient characteristics can be obtained as ferroelectric memories at a maximum annealing temperature of 650° C. and it becomes possible to adopt a stack structure necessary for the highly integrated FRAM. In addition, a producing method according to this embodiment enables coarser crystal grains to be suppressed, thereby implementing a fine-structured film and an even surface, and leakage current to be reduced and moreover is suitable for a fine machining and for the production of a high-density device.

Figure 18:
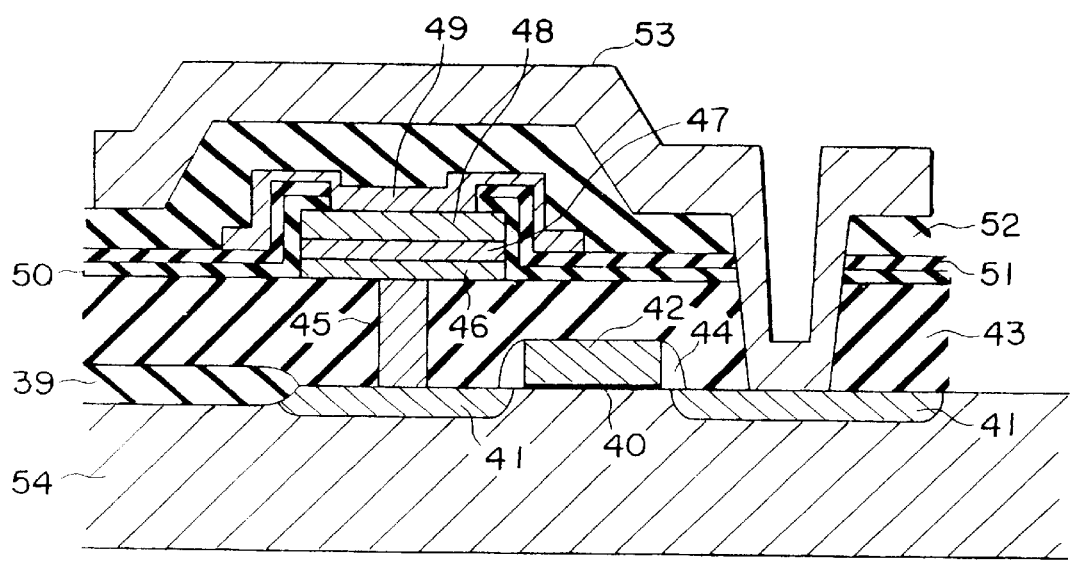
FIG. 18 is a sectional view of a ferroelectric memory element of a second embodiment according to the present invention.

Hereinafter, a second embodiment according to the present invention will be described referring to the drawings. FIG. 18 is a chief sectional view of a ferroelectric memory cell of second embodiment according to the present invention.

As shown in FIG. 18, a ferroelectric memory cell of this embodiment comprises a inter-element separating oxide film 39, a gate oxide film 40, a second conductive type impurity diffusion region 41, a polysilicon word line 42, inter-layer insulating films 43, 44, 51 and 52, a memory section contact plug 45, a TiN barrier metal layer 46, a Pt lower electrode 47, a ferroelectric film 48, a Pt plate wire 49, a $Ta_2O_5$ barrier insulating film 50 and an Al bit line 53 provided on a first conductive type silicon substrate 54.

Next, this producing method for ferroelectric memory cells will be described referring to FIGS. 19a to 19d, explanatory drawings showing one example of producing method for a ferroelectric memory of the structure shown in FIG. 18.

Figure 19A:
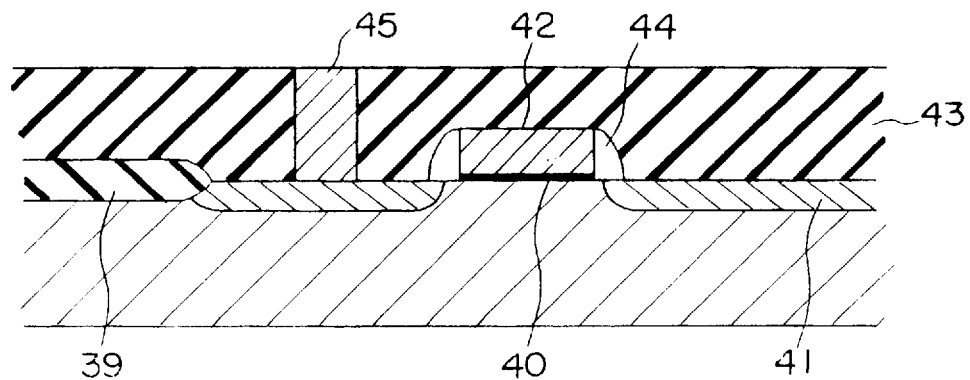

As shown in FIG. 19a, after a switching transistor is formed in accordance with a well known MOSFET forming process and is covered with an inter-layer insulating film 43, a contact hole is bored only in the portion of the bit line contacting the impurity diffusion region 41 of the substrate by using the well known photolithography method and dry etching method and impurity diffused polysilicon is embedded there, thereafter the surface of both the inter-layer insulating film 43 and the polysilicon plug 45 is leveled out by the well known CMP (chemical Mechanical Polishing) method.

Figure 19B:
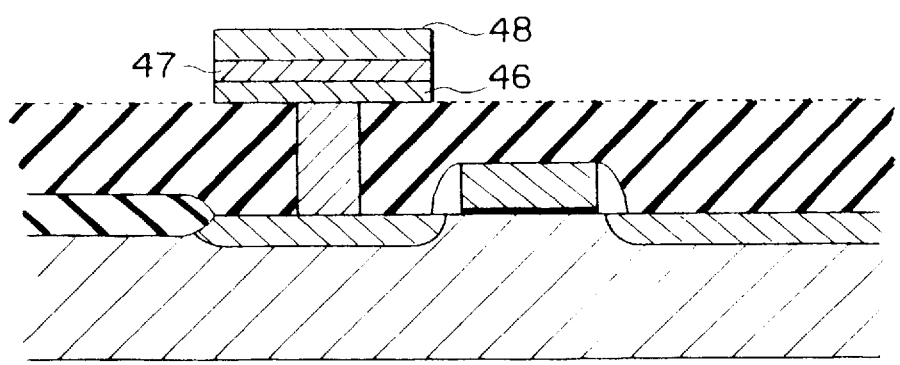

Next, as shown in FIG. 19b, after a TiN barrier metal layer 46 is deposited in a film thickness of 2000 Å by the well known sputtering method, a Pt film 47 is deposited in a film thickness of 1000 Å to make a bottom electrode. On this bottom electrode, an $SrBi_2Ta_2O_9$ film (hereinafter, referred to as SBT film) is scheduled to be formed as ferroelectric film 48, but description will be omitted of a synthesis method for the precursor solution employed for the formation of an SBT film and the steps leading to the first annealing in the process for forming an SBT film by using this precursor solution because they are the same as the steps extending from the step S1 to the step S13.

The SBT film 48, the Pt bottom electrode 47 and the TiN barrier metal layer 46 after the first annealing are machined to the size of 3.0 μm square by the well known photolithography method and dry etching method to make such a shape as shown in FIG. 19b. For dry etching, an ECR etcher is employed and the gas species used are a gas mixture comprising Ar, $Cl_2$ and $CF_4$ for the SBT film, a gas mixture comprising $C_2F_6$, $CHF_3$ and $Cl_2$ for the Pt bottom electrode and $Cl_2$ gas for the TiN barrier metal. At this time, since the SBT film and Pt bottom electrode are very fine in structure and even, a precise micro-machining is executable and the CD loss can be suppressed to 0.1 μm or smaller.

Figure 19C:
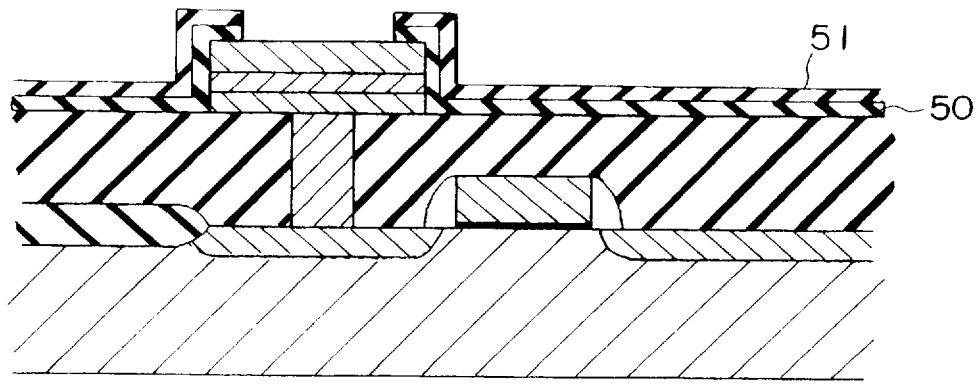

Next, as shown in FIG. 19c, a 300 Å $Ta_2O_5$ barrier insulating film 50 is deposited by the well known sputtering method, then a 150 Å silicon oxide film is deposited as an inter-layer insulating film 51 by the well-known CVD method and thereafter a 2.0 μm square contact hole is formed above the SBT film by the well-known photolithography method and dry etching method.

Figure 19D:
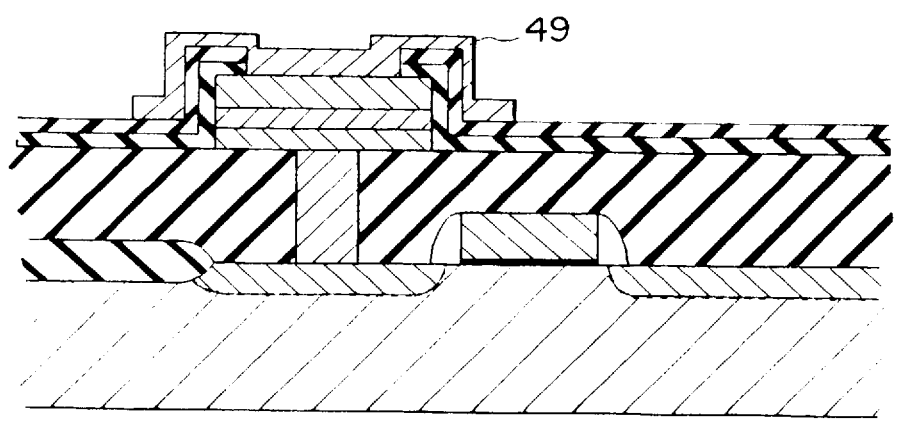

Next, as shown in FIG. 19d, after a 1000 Å Pt upper electrode is formed by the well-known sputtering method and is machined to a plate wire 49 by the well known photolithography method and dry etching method, a 600° C. and 30 min heat treatment is performed as the second heat treatment by the RTA method to crystallize an SBT film. The section of the SBT film after crystallization was yet very smooth and fine-structured and did not injure the shape of a ferroelectric capacitor. Meanwhile, the film thickness of the SBT film was measured to be 2000 Å.

Thereafter, an inter-layer insulating film 52 is deposited and leveled by using the CVD method on the basis of the well known leveling technique, a contact hole is formed in the other impurity diffusion region of the switching transistor by using the well known photolithography method and dry etching method, a bit line 53 is formed using the well known Al wiring technique and thus a ferroelectric memory cell shown in FIG. 18 is completed.

Electric characteristics of the ferroelectric memory cell produced in this manner were measured using the well known Soya Tower circuit. FIG. 20 is a graph showing the hysteresis loop obtained on measurement at an applied voltage of 3 V. The shape of the hysteresis loop is good and values of 5 $\mu C/cm^2$ and 30 kV/cm (0.6 V) are obtained for remanent polarization Pr and coercive field Ec, respectively, so that a sufficient operation as ferroelectric capacitor was confirmed. In addition, a value of leakage current for an applied voltage of 3 V is $5\times10^{-8} A/cm^2$, so that a sufficient operation as ferroelectric capacitor was confirmed again.

FIG. 21 is a graph in which a change in accumulated charge δQ relative to number of polarization reversals is plotted for cases where polarization reversals were made under application of a 3 V and 1 MHz pulse. Even after $2\times10^{11}$ cycles of polarization reversals, no change whatever is observed in accumulated charge and a good characteristic is indicated as nonvolatile memory.

Hereinafter, a third embodiment according to the present invention will be described referring to the drawings. With respect to a ferroelectric film element similar to that of the first embodiment mentioned above, the third embodiment is for the purpose of explaining the relation between the maximum crystal grain size of crystal particles constituting the SBT film and the accumulated charge.

Third embodiment of ferroelectric film element differs from the first embodiment mentioned above only in that the shape of the Pt top electrode 6 is modified into a plurality of 2 μm square separated rods but is quite equal to the first embodiment in the other points such as structure and producing method, to say nothing of forming process of an SBT film.

With respect to the third embodiment of ferroelectric film element having a capacitor structure, FIG. 22 shows variations in accumulated charge δQ relative to the maximum crystal grain size of an SBT film when measured at 100 places of a 2 μm square Pt top electrode. In FIG. 22, the ordinate represents a value of the standard deviation (σ) of accumulated charge δQ divided by the average ($\delta Q_{AVE}$) of accumulated charge δQ and the abscissa represents the maximum crystal grain size of an SBT film. FIG. 22 reveals that $\sigma/\delta Q_{AVE}$ is 10% or less for films of maximum crystal grain size not greater than 1000 Å and variations of accumulated charge δQ are very small but a value of $\sigma/\delta Q_{AVE}$ is so large that a stable characteristic is hardly attainable. Thus, when the second annealing temperature is 650° C. or lower, as described for the first embodiment, since a fine-structured film having a maximum crystal grain size of 700 Å or smaller is obtained, the obtained film is found to have hardly any variation and be good in ferroelectric characteristics. From this it is concluded that the second annealing temperature is preferably in the range of 500° C.–650° C. for obtaining an SBT film of a small variation in characteristics.

Hereinafter, a fourth embodiment according to the present invention will be described referring to the drawings. With the fourth embodiment, in the step S15 of FIG. 2 shown for the above first embodiment, the RTA method was employed and a 600° C. and 30 min annealing was made in a 1–760 Torr atmosphere of oxygen as second annealing (principal annealing) but otherwise for the structure of a ferroelectric element, other producing steps and the like, the fourth embodiment is quite the same as the first embodiment. Incidentally, the reason why the atmosphere gas pressure of the second annealing (second annealing pressure) is set at the range of 1–760 Torr is that the lower limit is chosen at 1 Torr at which the formed SBT film indicated hardly any ferroelectricity and the upper limit is chosen at 760 Torr equal to the atmospheric pressure.

FIGS. 23, 24 and 25 are graphs showing ferroelectric characteristics of the film obtained in the producing steps mentioned above relative to atmosphere gas pressure of the second annealing (second annealing pressure). Measurements of ferroelectric characteristics were made for a capacitor of the type shown in FIG. 1 with the applied voltage set at 3 V by using a well known Soya Tower circuit.

FIG. 23 is a graph showing values of remanent polarization Pr relative to atmosphere gas pressure of the second annealing (second annealing pressure). At an atmosphere gas pressure of 760 Torr, hardly any ferroelectricity was exhibited but a value of Pr increases with lowering gas pressure, reaches a maximum near a pressure of 5 Torr and decreases with a further lowering of gas pressure. At a gas pressure of 5 Torr, the remanent polarization Pr was 5.5 $\mu C/cm^2$ and the coercive field Ec was 25 kV/cm, so that sufficient characteristics were obtained as ferroelectric capacitor. In addition, from FIG. 23 Pr is found to be 2.5 $\mu C/cm^2$ or greater if the atmosphere gas pressure of the second annealing (second annealing pressure) is in the range of 2 Torr–20 Torr, which exhibits a sufficient ferroelectric characteristic.

FIG. 24 is a graph showing values of accumulated charge $\delta Q$ relative to atmosphere gas pressure of the second annealing (second annealing pressure). As with remanent polarization Pr, a value of accumulated charge $\delta Q$ increases with lowering atmosphere gas pressure from 760 Torr, reaches a maximum near a pressure of 5 Torr and decreases with a further lowering of gas pressure. At a gas pressure of 5 Torr, an excellent value of 10.2 $\mu C/cm^2$ was obtained as accumulated charge $\delta Q$. In addition, generally for a ferroelectric memory at an integrated degree of Mbit class, an accumulated charge of 5 $\mu C/cm^2$ or greater is required. Accordingly, it is found from FIG. 24 that the accumulated charge $\delta Q$ is 5 $\mu C/cm^2$ or greater for the range of 2 Torr–20 Torr and a memory produced in this range of pressure can acquire a sufficient accumulated charge $\delta Q$ needed as a ferroelectric memory at an integrated degree of Mbit class. Furthermore, as a result of observing the SBT film produced under this second annealing pressure the SBT film can be confirmed to be fine-structured and have a good surface evenness.

FIG. 25 is a graph showing a value of coercive field Ec relative to atmosphere gas pressure of the second annealing (second annealing pressure). For second annealing pressure ranging from 2 Torr to 200 Torr, Ec exhibits an almost constant value in the neighborhood of 25 kV/cm.

FIG. 26 is a graph showing a change in leakage current density relative to atmosphere gas pressure of the second annealing (second annealing pressure) under application of 3 V. For any value of second annealing pressure, good values of leakage current density on the order of $10^{-7}$ to $10^{-8}$ are obtained.

FIG. 27 is an X ray diffraction pattern of a film relative to atmosphere gas pressure of the second annealing (second annealing pressure). In FIG. 27, a, b, c, d, e and f denotes that the second annealing pressure is 760 Torr, 200 Torr, 20 Torr, 10 Torr, 2 Torr and 1 Torr, respectively. Meanwhile, in FIG. 27, the abscissa denotes a diffraction angle 2θ (deg) and the ordinate denotes diffraction intensity (arbitrary intensity). Concerning the ordinate, a position at which the diffraction intensity=0 is moved for each second annealing pressure. And in FIG. 27, SBT (008), SBT (105), SBT (110) and SBT (200) denote diffraction peaks originating from $SrBi_2Ta_2O_9$ (SBT), δ-TaO (001) and δ-TaO (002) denote diffraction peaks originating from δ phase TaO, Si denotes diffraction peaks originating from the silicon substrate and Pt denotes diffraction peaks originating from the Pt lower electrode.

According to FIG. 27, polycrystalline peaks of SBT (SBT (008), SBT (105), SBT (110) and SBT (200)) appear for 2 Torr to 200 Torr, whereas no SBT peak but TaO peaks (δ-TaO (001) and δ-TaO (002)) appear for 1 Torr. And for 760 Torr, SBT peaks are very broad and therefore an amorphous film is thought to be formed. Observed results of this X ray diffraction reveals that a film exhibiting SBT peaks was obtained for atmosphere gas pressure ranging from 2 Torr to 200 Torr.

FIG. 28 is a graph showing a change in film composition ratio relative to atmosphere gas pressure of the second annealing (second annealing pressure). Since the result of EPMA measurements concerning the SBT film compositions reveals that, whereas the Ta composition and Sr composition were nearly constant independently of second annealing pressure, the Bi composition changed depending on second annealing pressure, FIG. 28 is a graphic representation of composition ratios Bi/Ta and Sr/Ta. According to FIG. 28, a value of Bi/Ta is much the same as the composition ratios of raw material stock (Bi/Ta=2.4/2=1.2) at 750 Torr, gradually decreases with lowering of second annealing pressure till 2 Torr and becomes stoichiometric (Bi/Ta=1.0) near 5 Torr.

And at a second annealing pressure of 1 Torr, a value of Bi/Ta abruptly decreases. Such a change in Bi composition is attributable to volatilization of Bi or diffusion of Bi to electrodes at the time of second annealing and such a large shift of Bi composition is considered to be a cause for the fact that hardly any ferroelectricity was obtained at a second annealing pressure of 1 Torr. On the other hand, since the Ta composition and Sr composition were almost constant independently of second annealing pressure as mentioned above, Sr/Ta was also nearly constant and was much the same as the composition ratio of raw material stock (Sr/Ta=1/2=0.5).

Incidentally, in the above first to fourth embodiments, SBT ($SrBi_2Ta_2O_9$) was employed as material of ferroelectric films, but the materials are not limited to this and Sr- and Bi-contained compounds containing at least either one of Ta or Ti, such as $SrBi_2(Ti, Nb)_2O_9$, $SrBi_4Ti_4O_{15}$ and $SrBi_4(Ti, Zr)_4O_{15}$ are preferable. Furthermore, the present invention is applicable to others provided they are bismuth layer-structured compound materials capable of forming a film by using the sol-gel method or MOD method, such as $SrBi_2Nb_2O_9$, $Bi_4Ti_3O_{12}$, $CaBi_2Ta_2O_9$, $BaBi_2Ta_2O_9$, $BaBi_2Nb_2O_9$ and $PbBi_2Ta_2O_9$.

In a producing method for ferroelectric film element by the sol-gel method and the MOD method according to the present invention, after applying a precursor solution comprising component elements of a ferroelectric film material to the substrate and drying, the conventional RTA heat treatment step for removing the organic component in the film is omitted and the application drying step is repeated at several times to form a predetermined film thickness, then as a second heat treatment step, after the formation of a ferroelectric film by the first heat treatment step, the ferroelectric film is crystallized by drying in the atmosphere of 1 atm or lower gas pressure, so that the lowering of a film forming temperature becomes possible as compared with a conventional producing method. Furthermore, a film produced by this producing method becomes a fine-structured film of small grain size and thus a ferroelectric film exhibiting a small leakage current and a high insulation resistance can be obtained.

To be more specific, though hardly any crystallization was made at annealing temperatures of 650° C. or lower and moreover annealing of 730° C. or higher was required for obtaining characteristics needed as ferroelectric memories in a conventional producing method, a producing method according to the present invention enables the annealing temperature to be lowered by 100° C. or more and permits sufficient characteristics as memory to be obtained at as low annealing temperature as 600° C., so that integration of ferroelectric memories using a stack structure becomes possible.

In addition, since a film produced by a producing method for ferroelectric film elements can achieve a fine structure and an even surface of the film by suppressing the coarse granulation of crystal particles and is suitable also for a fine machining, so that the production of a higher-density device becomes implementable.

Many widely different embodiments of the present invention may be constructed without departing from the sprit and scope of the present invention. It should be understood that the present invention is not limited to the specific embodiments described in the specification, except as defined in the appended claims.

What is claimed is:

1. A method for producing a ferroelectric element comprising the steps of:

forming a lower electrode layer on a substrate;

applying a metal-contained precursor solution to the surface of said lower electrode;

drying said precursor solution applied to the surface so as to remove only said solution by heating;

a first heat treatment for heating the dried precursor to form a ferroelectric film;

forming an upper electrode layer on said ferroelectric film; and a second heat treatment for heating the formed film element in a gas-pressurized atmosphere of lower than 1 atmosphere.

2. A method according to claim 1, wherein the gas pressure in the atmosphere of said second heat treatment step is equal to or lower than 20 Torr.

3. A method according to claim 2, wherein the gas pressure in the atmosphere of said second heat treatment step is within a range from 2 Torr to 20 Torr.

4. A method according to claim 1, wherein the heating temperature of said second heat treatment step is within a range from 500° C. to 650° C.

5. A method according to claim 1, wherein said precursor solution comprises a metal carboxyl and an alkoxid.

* * * * *